(12) United States Patent
Jeon et al.

(10) Patent No.: US 11,595,155 B2
(45) Date of Patent: Feb. 28, 2023

(54) METHOD FOR DECODING LOW DENSITY PARITY CHECK (LDPC)-CODED SIGNAL, AND TERMINAL THEREFOR

(71) Applicant: LG ELECTRONICS INC., Seoul (KR)

(72) Inventors: Kijun Jeon, Seoul (KR); Sangrim Lee, Seoul (KR)

(73) Assignee: LG ELECTRONICS INC., Seoul (KR)

(*) Notice: Subject to any disclaimer, the term of this patent is extended or adjusted under 35 U.S.C. 154(b) by 0 days.

(21) Appl. No.: 17/309,931

(22) PCT Filed: Jan. 9, 2019

(86) PCT No.: PCT/KR2019/000319
§ 371 (c)(1),
(2) Date: Jul. 1, 2021

(87) PCT Pub. No.: WO2020/145430
PCT Pub. Date: Jul. 16, 2020

(65) Prior Publication Data
US 2022/0077957 A1    Mar. 10, 2022

(51) Int. Cl.
*H04L 1/00* (2006.01)
*G06N 3/04* (2006.01)
*H03M 13/11* (2006.01)

(52) U.S. Cl.
CPC ............ *H04L 1/0057* (2013.01); *G06N 3/04* (2013.01); *H03M 13/1125* (2013.01); *H04L 1/0068* (2013.01)

(58) Field of Classification Search
CPC ....... H04L 1/0057; H04L 1/0068; G06N 3/04; H03M 13/1125; H03M 13/00; H03M 13/11
See application file for complete search history.

(56) References Cited

U.S. PATENT DOCUMENTS

2010/0229066 A1* 9/2010 Matsumoto .......... H03M 13/116
714/752
2018/0343017 A1* 11/2018 Kumar .................... G06N 3/08
(Continued)

FOREIGN PATENT DOCUMENTS

KR    20110065393    6/2011
KR    20120047788    5/2012
(Continued)

OTHER PUBLICATIONS

PCT International Application No. PCT/KR2019/000319, International Search Report dated Oct. 17, 2019, 16 pages.

*Primary Examiner* — Thien Nguyen
(74) *Attorney, Agent, or Firm* — Lee Hong Degerman Kang Waimey

(57) ABSTRACT

Proposed is a method for a terminal to decode a signal. In particular, the method for a terminal to decode a signal comprises: a step for demodulating a first low density parity check (LDPC)-coded signal; and a step for decoding a second signal obtained from the first demodulated signal through a trained neural network. The second signal is obtained by using: an output sequence generated on the basis of the trained neural network; and a log likelihood ratio (LLR) sequence of the first signal.

12 Claims, 12 Drawing Sheets

(56) References Cited

U.S. PATENT DOCUMENTS

2021/0110241 A1* 4/2021 Tullberg ............ H03M 13/1191
2021/0142158 A1* 5/2021 Agrawal ............ H03M 13/1111
2022/0004848 A1* 1/2022 Hoydis .................. G06N 3/063

FOREIGN PATENT DOCUMENTS

KR    20130012549    2/2013
KR    20150004489    1/2015

* cited by examiner

METHOD FOR DECODING LOW DENSITY PARITY CHECK (LDPC)-CODED SIGNAL, AND TERMINAL THEREFOR

CROSS-REFERENCE TO RELATED APPLICATIONS

This application is the National Stage filing under 35 U.S.C. 371 of International Application No. PCT/KR2019/000319, filed on Jan. 9, 2019, the contents of which is hereby incorporated by reference herein in its entirety.

TECHNICAL FIELD

The present disclosure relates to wireless communications, and more particularly, to a method of decoding an LDPC-coded signal using a trained neural network and user equipment therefor.

BACKGROUND ART

Next-generation mobile communication systems beyond 4G assume multipoint cooperative communication, where multiple transmitters and receivers exchange information in a network composed thereof, to maximize information transfer rates and avoid communication shaded areas. According to information theory, in such a communication environment, flexible information transmission over multipoint channels formed in the network may not only increase the transfer rate but also reach the total network channel capacity, compared to when all information is over point-to-point channels. However, it is difficult to design codes capable of achieving the network channel capacity in practical terms, which has not been solved yet. That is, the code design is one of the important challenges to be solved. Thus, it is expected that turbo codes or low-density parity-check (LDPC) codes optimized for point-to-point channels will be still used in communication systems in the near future such as 5G.

Meanwhile, LDPC code is characterized in being capable of high parallelism with good error correction performance. In addition, owing to such advantages as provision of high data throughput, facilitation of hardware implementation, and the like LDPC has been commercialized in standards such as DVB-T2, WLAN and NR. Generally, if the design of an LDPC code parity check matrix intends to provide good waterfall performance, high degree variable nodes (VNs), degree-2 VNs & degree-1 VNs, and punctured VNs should be included. In addition, as a decoder of LDPC code, an iterative decoder based on Belief Propagation (BP) such as sum product algorithm, min-sum algorithm, etc. is used. The iterative decoder is a low-complexity decoder having linear complexity.

The iterative decoder is known as an optimal decoder that approaches maximum-likelihood from the asymptotic perspective like a case that a codeword length is infinite. Yet, in a practical system that has a finite codeword length, it is a suboptimal decoder that is not optimal. Namely, a cycle exists in a parity check matrix used for a sequence having a finite codeword length, and such a cycle causes dependency to a message in iterative decoding. Consequently, the shorter a codeword length becomes, the worse the performance loss gets. Due to this reason, NR has adopted polar code as a channel coding scheme of a control channel instead of LDPC code.

DETAILED DESCRIPTION OF DISCLOSURE

Technical Task

The technical task of the present disclosure is to provide a method of decoding an LDPC coded signal by a User Equipment (UE). Specifically, the present disclosure provides a method that a UE decodes a signal coded with a short Low Density Parity Check (LDPC) code having a relatively short codeword length using a trained neural network.

It will be appreciated by persons skilled in the art that the objects that could be achieved with the present disclosure are not limited to what has been particularly described hereinabove and the above and other objects that the present disclosure could achieve will be more clearly understood from the following detailed description.

Technical Solutions

In one technical aspect of the present disclosure, provided is a method of decoding a signal by a UE, the method including demodulating a first signal that is Low Density Parity Check (LDPC) coded and decoding a second signal obtained from the demodulated first signal through a trained neural network. Meanwhile, the second signal may be obtained using an output sequence generated based on the trained neural network and a Long Likelihood Ratio (LLR) sequence of the first signal.

The LDPC coded first signal may include a short LDPC coded signal having a codeword length smaller than a prescribed value.

An output sequence generated based on the trained neural network may include a punctured bit and the second signal may include a combination of the punctured bit and an LLR sequence of the first signal.

The second signal may include a combination of an output sequence generated based on the trained neural network and a parity bit included in the first signal.

An output sequence generated based on the trained neural network may include a punctured bit and a codeword sequence, and the second signal may include a combination of a weighted sum of the codeword sequence and the LLR sequence of the first signal and the punctured bit.

The neural network may be trained through a step of setting a parameter for training and a step of configuring a hidden layer of the neural network.

The hidden layer configuring step may include a step of determining the number of layers and a size and cost function of each of the layers.

A size of a first layer of the hidden layer may be equal to a sequence size of the demodulated first signal.

Advantageous Effects

Accordingly, in a method of decoding an LDPC coded signal by a UE according to one aspect of the present disclosure, a performance loss of a conventional iterative decoder can be improved in short LDPC code having a relatively short codeword length.

It will be appreciated by persons skilled in the art that the effects that could be achieved with the present disclosure are not limited to what has been particularly described hereinabove and other advantages of the present disclosure will be more clearly understood from the following detailed description.

DESCRIPTION OF DRAWINGS

The accompanying drawings, which are included to provide a further understanding of the present disclosure and are incorporated in and constitute a part of this specification, illustrate embodiments of the disclosure and together with the description serve to explain the principles of the disclosure.

BEST MODE FOR DISCLOSURE

Figure 1:
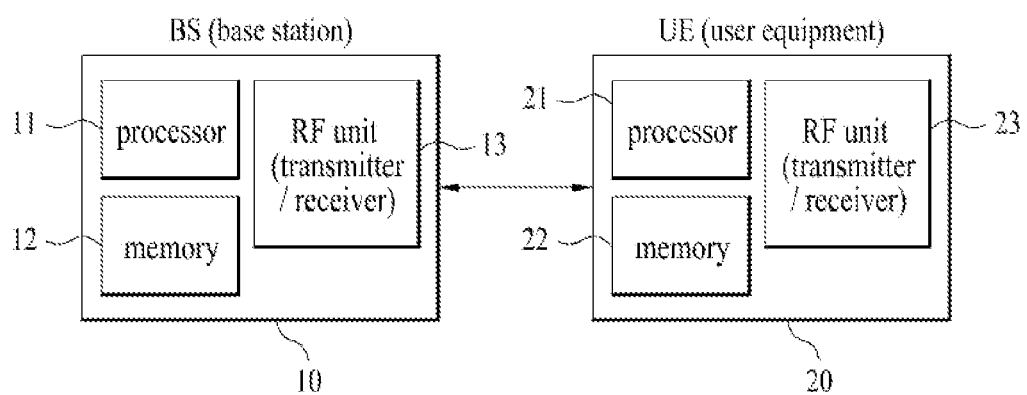
FIG. 1 is a diagram showing an exemplary system for implementing the present disclosure.

Reference will now be made in detail to the preferred embodiments of the present disclosure, examples of which are illustrated in the accompanying drawings. In the following detailed description of the disclosure includes details to help the full understanding of the present disclosure. Yet, it is apparent to those skilled in the art that the present disclosure can be implemented without these details. For instance, although the following descriptions are made in detail on the assumption that a mobile communication system includes the 3GPP LTE and LTE-A systems, the following descriptions are applicable to other random mobile communication systems by excluding unique features of the 3GPP LTE and LTE-A systems.

Occasionally, to prevent the present disclosure from getting vaguer, structures and/or devices known to the public are skipped or can be represented as block diagrams centering on the core functions of the structures and/or devices. Wherever possible, the same reference numbers will be used throughout the drawings to refer to the same or like parts.

Besides, in the following description, assume that a terminal is a common name of such a mobile or fixed user stage device as a user equipment (UE), a mobile station (MS), an advanced mobile station (AMS) and the like. In addition, assume that a base station (BS) is a common name of such a random node of a network stage communicating with a terminal as a Node B (NB), an eNode B (eNB), an access point (AP) and the like.

In a mobile communication system, a UE can receive information from a BS in downlink and transmit information in uplink. The UE can transmit or receive various data and control information and use various physical channels depending types and uses of its transmitted or received information.

The following technology may be used in various wireless access systems such as code division multiple access (CDMA), frequency division multiple access (FDMA), time division multiple access (TDMA), orthogonal frequency division multiple access (OFDMA), single carrier frequency division multiple access (SC-FDMA), and so on. CDMA may be implemented as a radio technology such as universal terrestrial radio access (UTRA) or CDMA2000. TDMA may be implemented as a radio technology such as global system for mobile communications (GSM)/general packet radio service (GPRS)/enhanced data rates for GSM evolution (EDGE). OFDMA may be implemented as a radio technology such as institute of electrical and electronics engineers (IEEE) 802.11 (wireless fidelity (Wi-Fi)), IEEE 802.16 (worldwide interoperability for microwave access (WiMAX)), IEEE 802.20, evolved UTRA (E-UTRA), and so on. UTRA is a part of universal mobile telecommunications system (UMTS). $3^{rd}$ generation partnership project (3GPP) long term evolution (LTE) is a part of evolved UMTS (E-UMTS) using E-UTRA, and LTE-advanced (LTE-A) is an evolution of 3GPP LTE Moreover, in the following description, specific terminologies are provided to help the understanding of the present disclosure. And, the use of the specific terminology can be modified into another form within the scope of the technical idea of the present disclosure.

FIG. 1 is a diagram illustrating a system for implementing the present disclosure.

Referring to FIG. 1, a wireless communication system includes a BS 10 and one or more UEs 20. On downlink (DL), a transmitter may be a part of the BS 10 and a receiver may be a part of the UE 20. On uplink (UL), the BS 10 may include a processor 11, a memory 12, and a radio frequency (RF) unit 13 (transmitter and receiver). The processor 11 may be configured to implement the proposed procedures and/or methods disclosed in the present application. The memory 12 is coupled to the processor 11 to store a variety of information for operating the processor 11. The RF unit 13 is coupled to the processor 11 to transmit and/or receive radio signals. The UE 20 may include a processor 21, a memory 22, and an RF unit 23 (transmitter and receiver). The processor 21 may be configured to implement the proposed procedures and/or methods disclosed in the present application. The memory 22 is coupled to the processor 21 to store a variety of information for operating the processor 21. The RF unit 23 is coupled to the processor 21 to transmit and/or receive radio signals. The BS 10 and/or the UE 20 may include a single antenna and multiple antennas. If at least one of the BS 10 or the UE 20 includes multiple antennas, the wireless communication system may be called a multiple input multiple output (MIMO) system.

In the present specification, although the processor 21 of the UE and the processor 11 of the BS perform an operation of processing signals and data, except for a function of receiving or transmitting signals and a function of storing signals, the processors 11 and 21 will not be especially mentioned for convenience of description. Even though the processors 11 and 21 are not particularly mentioned, it may be said that the processors 11 and 21 perform operations of processing data except for a function of receiving or transmitting signals.

The present disclosure proposes various new frame structure for a $5^{th}$ generation (5G) communication system. In the next generation 5G system, communication scenarios are classified into Enhanced Mobile Broadband (eMBB), Ultra-reliability and low-latency communication (URLLC), Massive Machine-Type Communications (mMTC), etc. Here, eMBB is the next generation mobile communication scenario having such properties as High Spectrum Efficiency, High User Experienced Data Rate, High Peak Data Rate and the like, URLLC is the next generation mobile communication scenario having such properties as Ultra Reliable, Ultra Low Latency, Ultra High Availability and the like (e.g., V2X, Emergency Service, Remote Control), and mMTC is the next generation mobile communication scenario having such properties as Low Cost, Low Energy, Short Packet, Massive Connectivity and the like (e.g., IoT).

Figure 2:
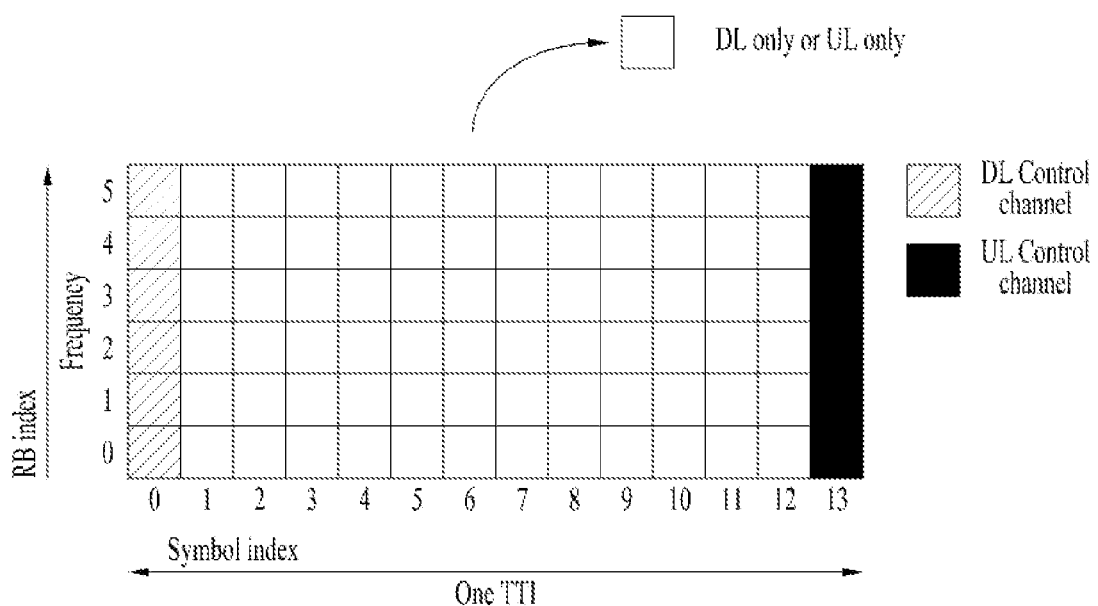
FIG. 2 is a diagram showing an exemplary subframe structure in which a data channel and a control channel are multiplexed in time division multiplexing (TDM).

FIG. 2 is a diagram illustrating an exemplary subframe structure in which a data channel and a control channel are multiplexed in time division multiplexing (TDM). In 5G NR, a frame structure in which a control channel and a data channel are multiplexed according to TDM like FIG. 2 may be considered in order to minimize latency.

In FIG. 2, the hatched area represents a transmission region of a DL control channel carrying DCI (e.g., PDCCH), and the last symbol represents a transmission region of a UL control channel carrying UCI (e.g., PUCCH). Here, the DCI is control information transmitted from a gNB to a UE and may include information on a cell configuration the UE should know, DL-specific information such as DL scheduling, UL-specific information such as a UL grant, etc. The UCI is control information transmitted from the UE to the gNB and may include a HARQ ACK/NACK report on DL data, a CSI report on a DL channel state, a scheduling request (SR), etc.

In FIG. 2, blank areas are available for flexible configuration of DL or UL periods to achieve DL/UL flexibility. For example, a blank area may be used as a data channel for DL data transmission (e.g., a physical downlink shared channel (PDSCH)) or a data channel for UL data transmission (e.g., a physical uplink shared channel (PUSCH)). This structure is characterized in that since a DL transmission and a UL transmission may be performed sequentially in one subframe, an eNB may transmit DL data in the subframe to a UE and receive an HARQ ACK/NACK signal for the DL data in the subframe from the UE. That is, the time required to retransmit data when a data transmission error occurs may be reduced, thereby minimizing the latency of final data transmission.

In the self-contained subframe structure, a time gap is necessary in order that the gNB and UE switch to a reception mode from a transmission mode, and vice versa. For the switching between the transmission mode and the reception mode, some OFDM symbols at the time of DL-to-UL switching may be configured as a guard period (GP) in the self-contained subframe structure.

Low Density Parity Check (LDPC) Code

LDPC cod is characterized in being advantageous for error correction and capable of high parallelism. In addition, LDPC code is commercialized in various standards such as DVB-T2, WLAN and NR owing to such advantages as provision of high data throughput, facilitation of hardware implementation and the like.

If good waterfall performance is provided in designing a Parity Check Matrix (PCM) of LDPC code, high degree variable nodes (VNs), degree-2 VNs & degree-1 VNs and punctured VNs should be included. In addition, as a decoder of LDPC code, an iterative decoder based on belief propagation such as sum product algorithm, min-sum algorithm, etc. is usable, which is a low-complexity decoder having linear complexity.

The iterative decoder is known as an optimal decoder that approaches maximum-likelihood from the asymptotic perspective like a case that a codeword length is infinite. Yet, in a real practical system like a case that a codeword length is finite, it is a suboptimal decoder that is not optimal. Namely, a cycle exists in a real parity check matrix used for a sequence having a finite codeword length, and such a cycle causes dependency to a message in iterative decoding. Therefore, he shorter a codeword length becomes, the worse the performance loss gets. For this reason, NR has adopted polar code as a channel coding scheme of a control channel instead of LDPC code.

In the following description, a preprocessing aided decoder structure will be described. A preprocessor may be one component of a processor. A preprocessing aided decoder based on deep learning will be described in the following. A training algorithm of a preprocessor aided decoder for decoding of a short LDPC coded signal will be described in the following. In addition, performance evaluation of a user equipment according to one aspect of the present disclosure will be described in the following.

Preprocessor Aided Decoder for Short LDPC Code

A brief propagation based iterative decoding algorithm has clear limitation for a PCM in which a multitude of short cycles exist. Particularly, a self-message reception makes it converge to local optimum in iterative decoding to cause message dependency, thereby resulting in performance degradation. To solve such a problem, it is necessary to improve reliability of a soft value input sequence (e.g., Log-Likelihood Ratio (LLR) of an iterative decoder. The present disclosure proposes a preprocessor that performs such an LLR enhancer function. According to LDPC code property that requires punctured bits for good performance, if a soft value of a punctured bit part through a preprocessor is predictable, it means that the preprocessor can greatly help performance improvement.

Figure 3:
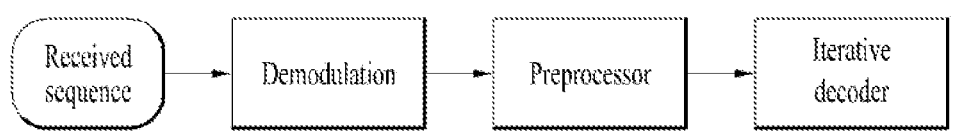
FIG. 3 is a diagram showing a structure of a user equipment for decoding an LDPC coded signal according to one aspect of the present disclosure.

A preprocessor aided decoder may be designed as the structure shown in FIG. 3. Mathematical modeling of the preprocessor shown in FIG. 3 is not easy, and the preprocessor has the property that it is good to be configured using Deep Learning (DL). A deep-learning based preprocessor designing method will be described as follows.

Deep Learning Based Preprocessor Aided Decoder for Short LDPC Code

Figure 4:
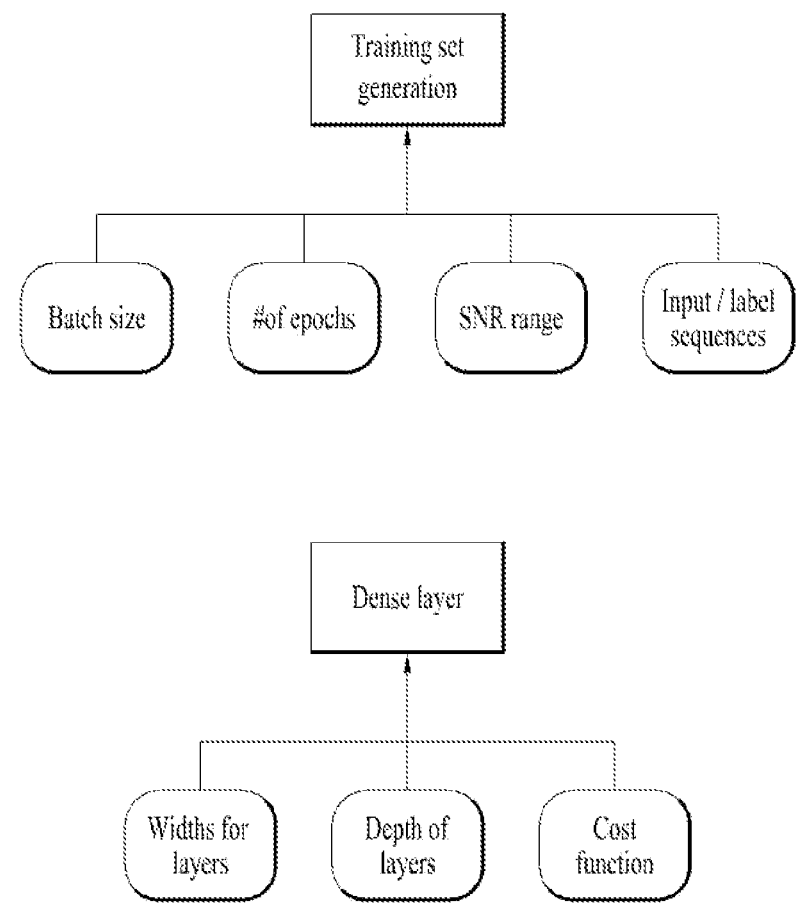
FIG. 4 is a diagram showing a deep learning based preprocessor of a user equipment according to one aspect of the present disclosure.

As shown in FIG. 4, the deep learning based preprocessor design may be categorized into two types: 1) training set generation; and 2) dense layer construction, depending on a supervised learning method.

First of all, the training set generation may consider the four points in the following.

1) Batch size (the number of distinct codewords to be trained)

2) # of maximum epochs (here, the epoch means that the whole is shown once)

3) Signal-to-Noise Ratio (SNR) range to cover

4) Input/label sequence set

PCM property is represented as a codeword ensemble. A batch size is a hyper parameter relating to whether to train all distinct codewords or some distinct codewords, and there exists a trade-off between performance and training phase complexity. The number of epochs determines training accuracy, and it is important to determine an appropriate number of epochs. If the epoch number is increased excessively, it may be cause overfitting. An SNR range to cover affects practical performance evaluation. Moreover, since the deep learning algorithm of the present disclosure is the supervised learning, a corresponding input/label sequence should be determined. The label sequence may include a K-length information sequence, a length-N codeword, or a $(N+N_p)$-length codeword containing a punctured intermediate parity bit sequence.

The dense layer construction may consider the three points in the following.
1) Depth (number) of layer(s)
2) Width per layer
3) cost function The above-listed three parameters are hyper parameters that are considered in the dense layer based deep learning in general. Since the dense layer construction will be configured in a manner of applying reLU (rectified Linear Unit) functions and a sigmoid function in a final output layer, a cross entropy function is used as a cost function. It is important to find the rest of hyper parameters appropriately by trial and error based on accuracy and overfitting of training, performance evaluation result and the like.

Figure 5:
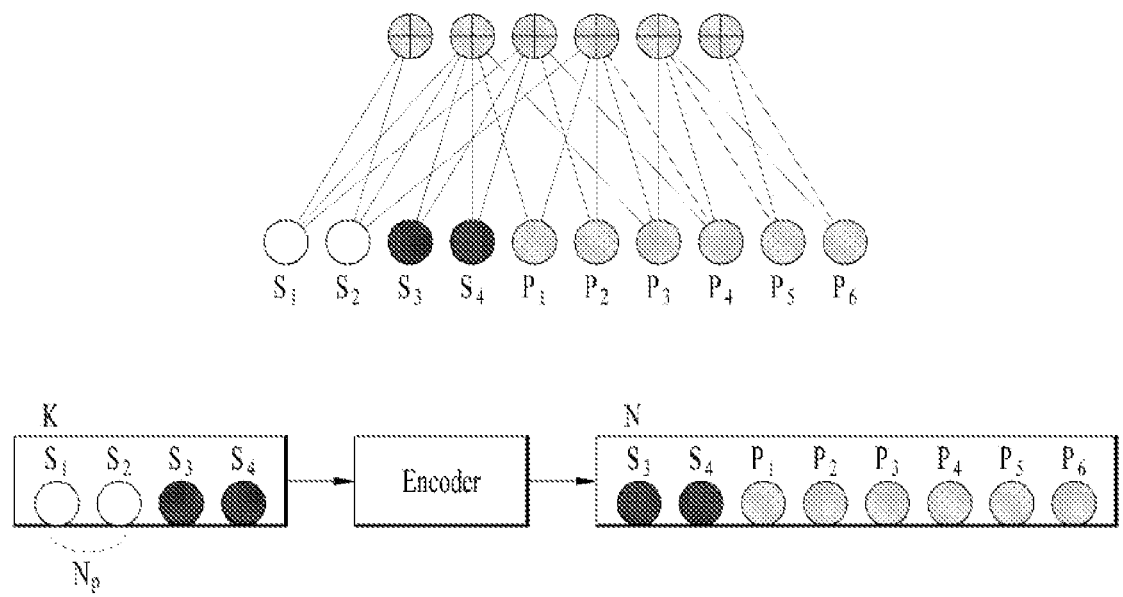
FIG. 5 is a diagram showing protograph and encoder input/output of a specific LDPC code in a user equipment according to one aspect of the present disclosure.
Figure 6:
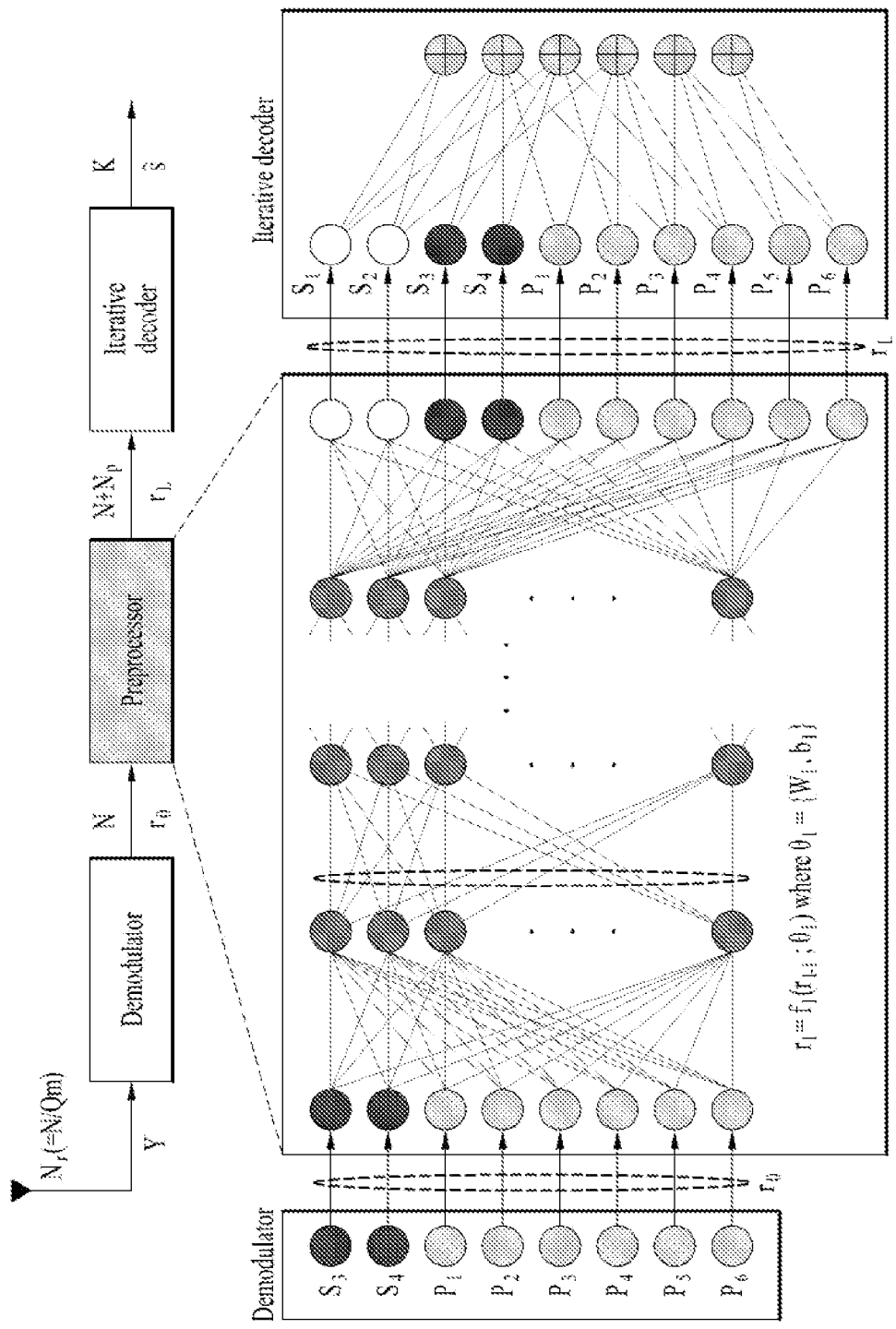
FIG. 6 to FIG. 9 are diagrams to describe a method of utilizing an original LLR and a preprocessor output by user equipment according to one aspect of the present disclosure.

In the following, a method of implementing a preprocessor, which is designed as a dense layer obtained through training, in a decoder will be described. A preprocessor may be regarded as an LLR enhancer or an LLR initializer. FIG. 5 is a diagram showing protograph and encoder input/output of specific LDPC code. With reference to FIGS. 5 to 9, the following four kinds of methods of utilizing original LLR and preprocessor output will be proposed.

method 1 FIG. 6 shows an example of a deep learning based preprocessor aided iterative decode according to method 1). According to method 1), a soft value of length $N+N_p$ is extracted as a preprocessor output by considering a labeled output sequence of length $N+N_p$ (targeting an encoded bit sequence) and then utilized as an LLR input.

Figure 7:
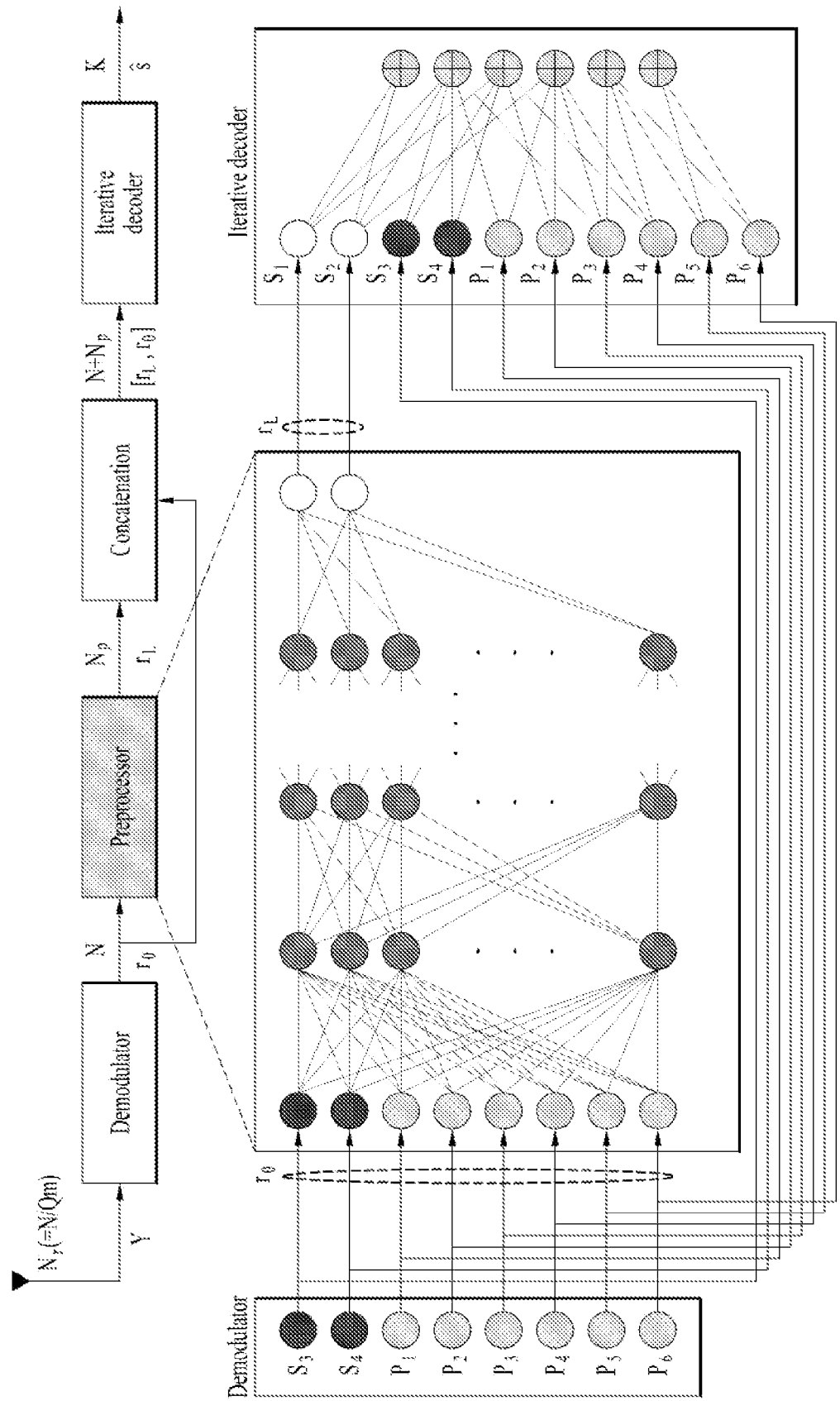
Figure 8:
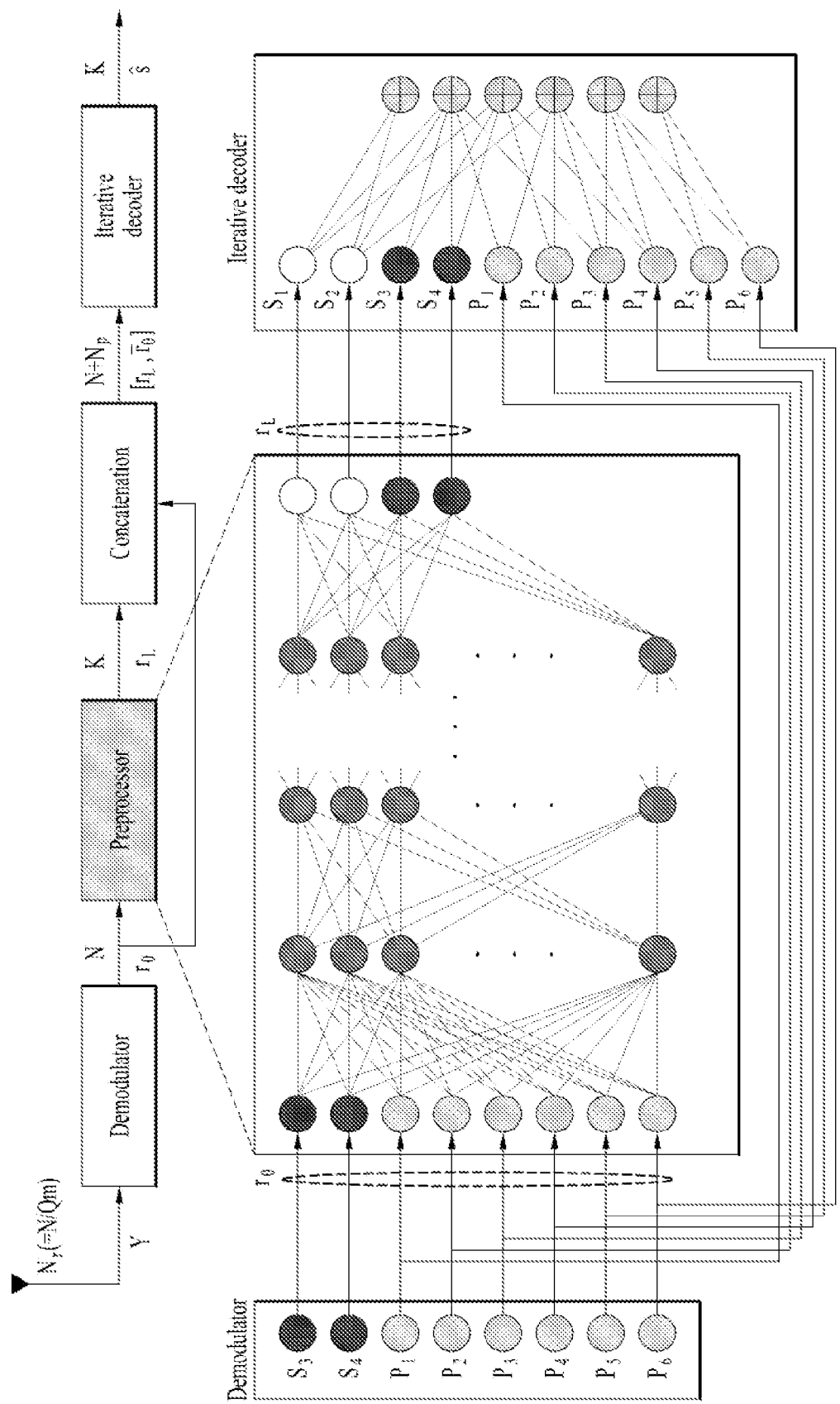
Figure 9:
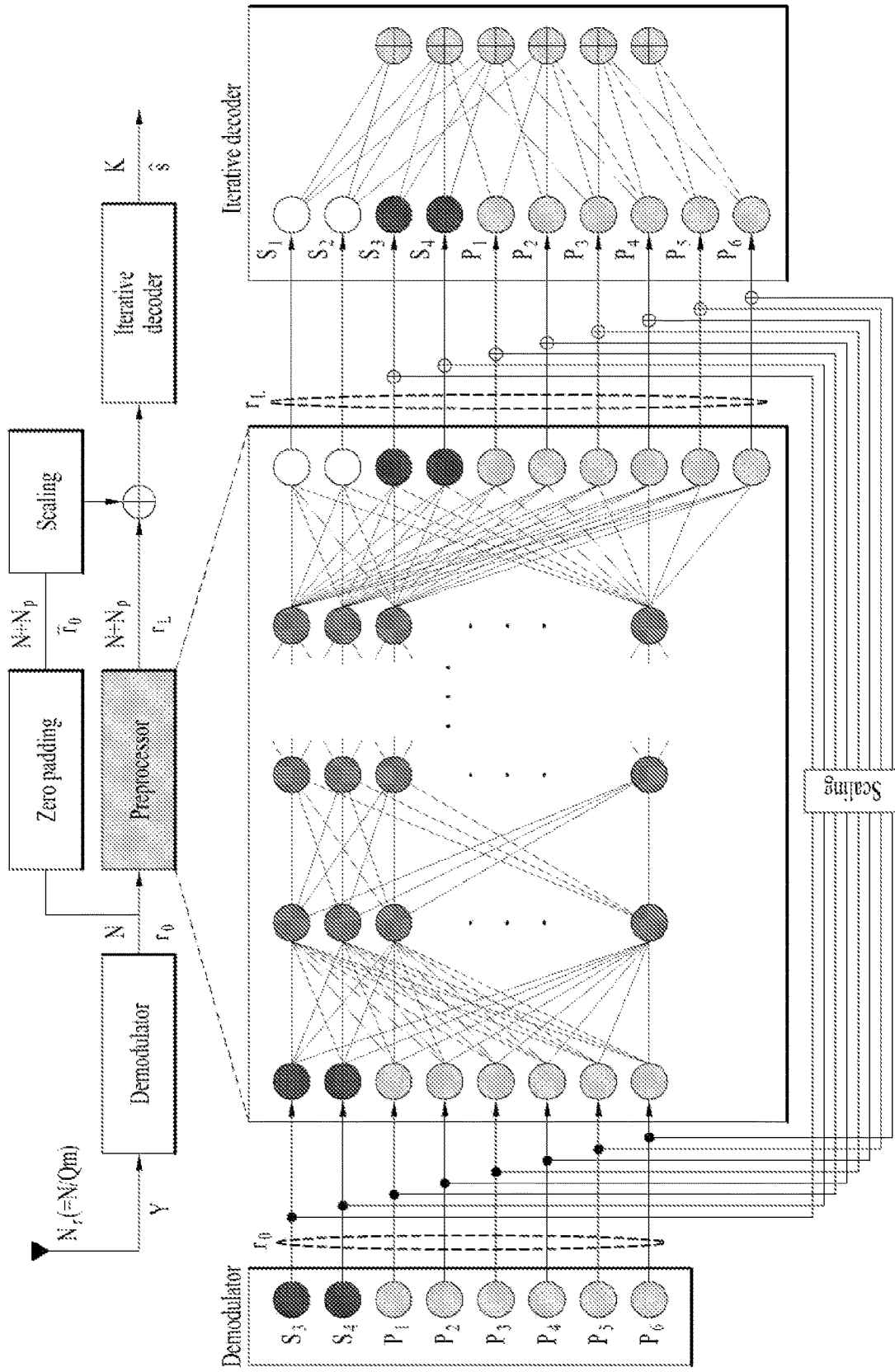

FIG. 7 shows an example of a deep learning based preprocessor aided iterative decode according to method 2). According to method 2), an LLR input corresponding to a punctured bit is utilized as a preprocessor output by considering a labeled output sequence of length $N_p$ (targeting a punctured bit sequence). As a rule, an LLR value in a punctured bit is initialized as zero due to uncertainty.

method 1 FIG. 8 shows an example of a deep learning based preprocessor aided iterative decode according to method 3). According to method 3), a soft value of length K is extracted as a preprocessor output by considering a labeled output sequence of length K (targeting a systematic information bit sequence) and then utilized as an LLR input of a systematic bit. According to method 3), a parity ($P_1$-$P_6$) bit of a demodulated signal can be used as an input of an iterative decoder.

method 4 FIG. 9 shows an example of a deep learning based preprocessor aided iterative decode according to method 4). According to method 4), a soft value of length $N+N_p$ is extracted as a preprocessor output by considering a labeled output sequence of length $N+N_p$ (targeting an encoded bit sequence) and an LLR value corresponding to a punctured bit (e.g., $S_1$, $S_2$) is substituted with the preprocessor output. An LLR input of the remaining length-N codeword sequence utilizes a weighed sum of an original LLR value and the preprocessor output as an LLR input.

Prior to the description of the present disclosure's proposal described as equations above, notations are summarized. In the following description, a regular character indicates a scalar, and a bold character indicates a vector or a matrix. A blackboard bold character means a set. For example, z, z (Z) and $\mathbb{Z}$ mean a scalar, a vector (or matrix) and a set, respectively. In addition, $|\mathbb{Z}|$ means cardinality of a set $\mathbb{Z}$ and $$(a)^+ = [\max(a_i, 0)]_{i=0}^{|a|-1}$$

means a sigmoid function. Meanwhile, $\mathbb{B}$ and $\mathbb{R}$ indicate a binary field and a real number field.

Let an information index set be $$\mathbb{I} = \{i\}_{i=1}^{2^K}.$$

$s_i = B_K(i): \mathbb{I} \mapsto \mathbb{B}^K$ means a K binary information sequence, where K is a length that an index i is mapped. A set of collecting such a binary information sequence is set as $$\mathbb{S} = \{s_i\}_{i=1}^{2^K}.$$

$c_i = \phi_H(s_i): \mathbb{S} \mapsto \mathbb{B}^{N+N_p}$ means a real $i^{th}$ codeword including punctured bits, and $$\overline{c}_i = [c_i[n]]_{n=N_p+1}^{N+N_p}$$

means a codeword of a length N by excluding a punctured bit. A possible codeword set including a punctured bit and a transmitted codeword set are defined as $$\mathbb{C} = \{c_i\}_{i=1}^{2^K}$$

and $$\overline{\mathbb{C}} = \{\overline{c}_i\}_{i=1}^{2^K},$$

respectively. A modulated symbol sequence is defined as $\tilde{Y} = \text{mod}(\overline{c}_i)$. A received sequence Y (observation) is defined as follows.

$$Y = \tilde{Y} + n \text{ where } n \sim CN(0, \rho) \quad \text{[Equation 1]}$$

Here, $\rho$ means a standard deviation of additive white Gaussian noise (awgn). A demodulated sequence will be represented as $r_0 = \text{demod}(Y)$.

A dense layer parameter $$\theta = \{W_l, b_l\}_{l=1}^{L}$$

is defined by a dense matrix $W_l$ and a bias vector $b_l$ of each layer. $W_l$ is an $n_l \times n_{l-1}$ matrix and $b_l$ is an $n_l \times 1$ vector. Moreover, a $1 \times n_l$ bias vector is defined as $b_l$. A mapping function of an $l^{th}$ layer is $f_l(r_{l-1}; \theta_l): \mathbb{R}^{n_{l-1}} \mapsto \mathbb{R}^{n_l}$, which is defined as follows.

$$r_l = f_l(r_{l-1}; \theta_l) = \begin{cases} (W_l r_{l-1} + b_l)^+, & l < L \\ \sigma(W_l r_{l-1} + b_l), & l = L \end{cases} \quad \text{[Equation 2]}$$

Here, L means a maximum layer index. In practical decoder implementation, a sigmoid operation of an L layer will be skipped. (Since a soft value having positive and negative values is necessary, a sigmoid operation is excluded.) Yet, in a training process, to find a cross-entropy based cost function, a sigmoid operation is necessary. This will be mentioned in the next training algorithm description. An input log-likelihood ratio (LLR) sequence (λ) to an iterative decoder according to methods 1 to 4 is defined as follows.

$$\lambda = \begin{cases} r_{L_{max}}, & \text{if the method 1 is applied} \\ [r_{L_{max}}; r_0], & \text{if the method 2 is applied} \\ [r_{L_{max}}; [r_0[n]]_{n=1}^{N_p}], & \text{if the method 3 is applied} \\ \alpha r_{L_{max}} + [0_{N_p}; r_{L_{max}}], & \text{if the method 4 is applied} \end{cases}$$ [Equation 3]

In an iterative decoder, decoding is performed by a conventional system using the above-found λ as an input.

Figure 10:
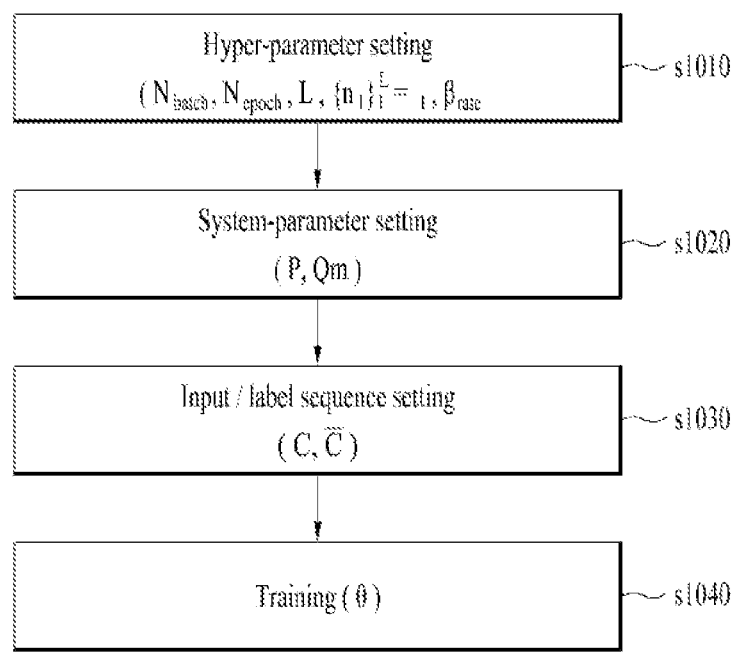
FIG. 10 is a diagram showing a training process of a deep learning based preprocessor user equipment according to one aspect of the present disclosure.

Training Algorithm of Deep Learning Based Preprocessor Aided Decoder for Short LDPC Code FIG. 10 is a diagram showing a training process of a deep learning based preprocessor. Prior to executing a training algorithm, hyper-parameter setting (s1010), system-parameter setting (s1020) and input/label sequence setting (s1030) are performed. As described above, in the hyper-parameter setting (s1010), a batch size, the epoch number, and depth and width of a layer are set. A training step S1040 is summarized as Table 1 in the following.

TABLE 1

Figure 11:
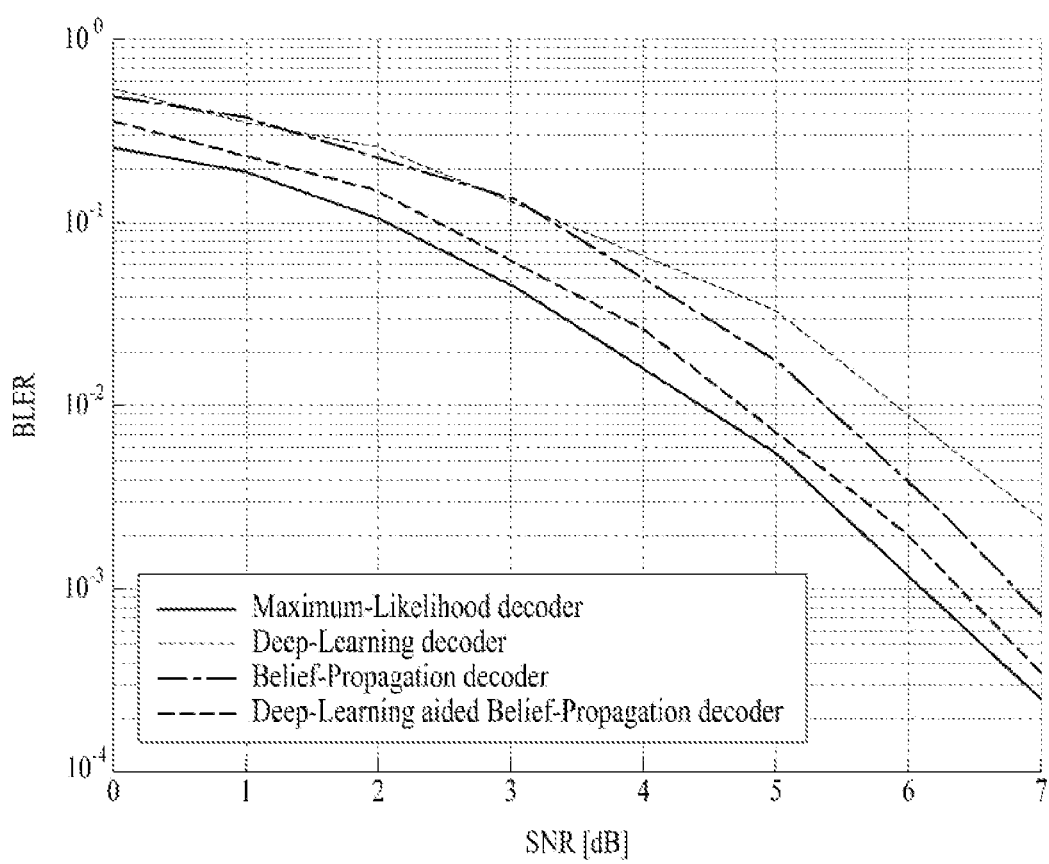
FIG. 11 is a diagram showing BLock Error Rate (BLER) performance according to a decoder type.

Input: $\bar{\mathbb{C}} = \{\bar{c}_i\}_{i=1}^{2^K}$, $\mathbb{C} = \{c_i\}_{i=1}^{2^K}$, $\mathbb{P} = [\rho_{min}, \rho_{max}]$, $\{n_l\}_{l=1}^{L}$
Output: $\theta = \{W_l, b_l\}_{l=1}^{L}$,
Initialization Phase: Initialize $\{W_l, b_l\}_{l=1}^{L}$,
Training Phase:
FOR $j = 1$ to $N_{epoch}$ minimize $L(\theta) = \frac{1}{|2^K|} \sum_{i=1}^{2^K} l(r_L, c_i)$ where $r_L = f_L( \ldots f_1(r_0; \theta_1); \theta_L)$
END Performance Evaluation FIG. 11 is a diagram showing Block Error Rate (BLER) performance according to a decoder type. Particularly, FIG. 11 shows Block Error Rate (BLER) performance according to a decoder type in AWGN channel environment when an information sequence of length 8 and an NR-LDPC code of a coding rate 1/2 are used and QPSK modulation is applied.

In FIG. 11, a preprocessor aided BP decoder assumes the aforementioned method 1, shows performance better than the case of using a Belief Propagation (BP) decoder or a Deep Learning (DL) decoder alone, and confirms to come close to maximum-likelihood decoder performance. So to speak, performance of an iterative decoder for short LDPC code is improved.

Figure 12:
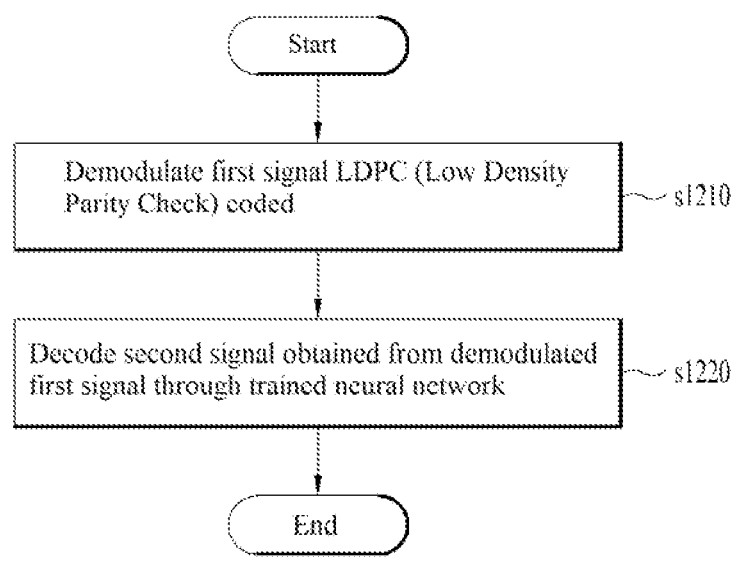
FIG. 12 is a diagram to describe a method of decoding a signal by a user equipment according to one aspect of the present disclosure.

FIG. 12 is a diagram to describe a method of decoding a signal by a UE according to one aspect of the present disclosure.

Referring to FIG. 12, a method of decoding a signal by a UE may include a step S1210 of demodulating a first signal that is Low Density Parity Check (LDPC) coded and a step S1220 of decoding a second signal obtained from the demodulated first signal through a trained neural network. Meanwhile, the second signal may be obtained using an output sequence generated based on the trained neural network and a Long Likelihood Ratio (LLR) sequence of the first signal.

The LDPC coded first signal may include a short LDPC coded signal having a codeword length smaller than a prescribed value.

An output sequence generated based on the trained neural network may include a punctured bit and the second signal may include a combination of the punctured bit and an LLR sequence of the first signal.

The second signal may include a combination of an output sequence generated based on the trained neural network and a parity bit included in the first signal.

An output sequence generated based on the trained neural network may include a punctured bit and a codeword sequence, and the second signal may include a combination of a weighted sum of the codeword sequence and the LLR sequence of the first signal and the punctured bit.

The neural network may be trained through a step of setting a parameter for training and a step of configuring a hidden layer of the neural network.

The hidden layer configuring step may include a step of determining the number of layers and a size and cost function of each of the layers.

A size of a first layer of the hidden layer may be equal to a sequence size of the demodulated first signal.

A user equipment decoding a signal according to one aspect of the present disclosure may include a decoder decoding the signal and a processor. The processor may demodulate a LDPC (Low Density Parity Check) coded first signal and control the decoder to decode a second signal obtained from the demodulated first signal through a trained neural network. The second signal may be obtained using an output sequence generated based on the trained neural network and a Long Likelihood Ratio (LLR) sequence of the first signal.

The LDPC coded first signal may include a short LDPC coded signal having a codeword length smaller than a prescribed value.

An output sequence generated based on the trained neural network may include a punctured bit and the second signal may include a combination of the punctured bit and an LLR sequence of the first signal.

The second signal may include a combination of an output sequence generated based on the trained neural network and a parity bit included in the first signal.

An output sequence generated based on the trained neural network may include a punctured bit and a codeword sequence, and the second signal may include a combination of a weighted sum of the codeword sequence and the LLR sequence of the first signal and the punctured bit.

The neural network may be trained through a step of setting a parameter for training and a step of configuring a hidden layer of the neural network.

The processor may configure the hidden layer based on determining the number of layers and a size and cost function of each of the layers.

A size of a first layer of the hidden layer may be equal to a sequence size of the demodulated first signal.

The embodiments of the present invention described above are combinations of elements and features of the present invention. The elements or features may be considered selective unless otherwise mentioned. Each element or feature may be practiced without being combined with other elements or features. Further, an embodiment of the present invention may be constructed by combining parts of the elements and/or features. Operation orders described in embodiments of the present invention may be rearranged. Some constructions of any one embodiment may be included in another embodiment and may be replaced with corresponding constructions of another embodiment. It is obvious to those skilled in the art that claims that are not explicitly cited in each other in the appended claims may be presented in combination as an embodiment of the present invention or included as a new claim by a subsequent amendment after the application is filed.

Those skilled in the art will appreciate that the present invention may be carried out in other specific ways than those set forth herein without departing from the spirit and essential characteristics of the present disclosure. The above embodiments are therefore to be construed in all aspects as illustrative and not restrictive. The scope of the disclosure should be determined by the appended claims and their legal equivalents, not by the above description, and all changes coming within the meaning and equivalency range of the appended claims are intended to be embraced therein.

MODE FOR DISCLOSURE

Various embodiments for implementation of the disclosure are described in BEST MODE FOR DISCLOSURE.

The above description are therefore to be construed in all aspects as illustrative and not restrictive. The scope of the disclosure should be determined by the appended claims and their legal equivalents, not by the above description, and all changes coming within the meaning and equivalency range of the appended claims are intended to be embraced therein.

INDUSTRIAL APPLICABILITY

The present disclosure is industrially applicable to various wireless communication systems such as 3GPP, LTE/LTE-A, 5G system, etc.

What is claimed is:

1. A method of decoding a plurality of bits by a user equipment (UE), the method comprising:
   receiving, from a base station (BS), a downlink signal which is modulated,
   wherein the downlink signal is not a control signal;
   demodulating, by a demodulator of the UE, the downlink signal to acquire encoded bits,
   wherein the encoded bits include (i) information bits and (ii) parity bits; and
   generating, by a trained neural network of the UE, labeled output bits by inputting the encoded bits into the trained neural network of the UE; and
   decoding, by a decoder of the UE, (i) the labeled output bits and (ii) at least one bit of the encoded bits directly from the demodulator based on a parity check matrix of a Low Density Parity Check (LDPC),
   wherein a number of the information bits is equal to or less than a specific value,
   wherein the number of the information bits is integer equal to or larger than 1, and
   wherein the specific value is integer lager than 1.

2. The method of claim 1, wherein the labeled output bits include a punctured bit.

3. The method of claim 1, wherein the at least one bit of the encoded bits is the parity bits.

4. The method of claim 1, wherein the trained neural network is trained through a step of setting a parameter for training and a step of configuring a hidden layer of the neural network.

5. The method of claim 4, wherein the hidden layer configuring step comprises a step of determining the number of layers and a size and cost function of each of the layers.

6. The method of claim 4, wherein a size of a first layer of the hidden layer is equal to a sequence size of the demodulated downlink signal.

7. A user equipment decoding a plurality of bits, comprising:
   a transceiver; and
   a demodulator;
   a trained neural network;
   a decoder; and
   a processor configured to:
      control the transceiver to receive, from a base station (BS), a downlink signal which is modulated,
      wherein the downlink signal is not control signal;
      control the demodulator to demodulate the downlink signal to acquire encoded bits,
      wherein the encoded bits include (i) information bits and (ii) parity bits;
      input the encoded bits into the trained neural network;
      control the trained neural network to generate labeled output bits; and
      control to the decoder to decode (i) the labeled output bits and (ii) at least one bit of the encoded bits directly from the demodulator based on a parity check matrix of a Low Density Parity Check (LDPC),
      wherein a number of the information bits is equal to or less than a specific value,
      wherein the number of the information bits is integer equal to or larger than 1, and
      wherein the specific value is integer lager than 1.

8. The user equipment of claim 7, wherein the labeled output bits include a punctured bit.

9. The user equipment of claim 7, wherein the at least one bit of the encoded bits is the parity bits.

10. The user equipment of claim 7, wherein the trained neural network is trained through a step of setting a parameter for training and a step of configuring a hidden layer of the neural network.

11. The user equipment of claim 10, wherein the processor configures the hidden layer based on determining the number of layers and a size and cost function of each of the layers.

12. The user equipment of claim 10, wherein a size of a first layer of the hidden layer is equal to a sequence size of the demodulated downlink first signal.

* * * * *